(12) United States Patent
Kim et al.

(10) Patent No.: US 10,718,809 B1
(45) Date of Patent: Jul. 21, 2020

(54) HISTORY MANAGEMENT PAD OF SEMICONDUCTOR TEST SOCKET, MANUFACTURING METHOD THEREOF, AND SEMICONDUCTOR TEST DEVICE INCLUDING HISTORY MANAGEMENT PAD

(71) Applicant: TSE CO., LTD, Cheonan-si, Chungcheongnam-do (KR)

(72) Inventors: Bo Hyun Kim, Cheonan-si (KR); Yoon Hyeong Lee, Cheonan-si (KR)

(73) Assignee: TSE CO., LTD, Cheonan-si, Chungcheongnam-do (KR)

( * ) Notice: Subject to any disclaimer, the term of this patent is extended or adjusted under 35 U.S.C. 154(b) by 0 days.

(21) Appl. No.: 16/633,375

(22) PCT Filed: Jul. 23, 2018

(86) PCT No.: PCT/KR2018/008285
§ 371 (c)(1),
(2) Date: Jan. 23, 2020

(87) PCT Pub. No.: WO2019/112134
PCT Pub. Date: Jun. 13, 2019

(30) Foreign Application Priority Data

Dec. 7, 2017 (KR) .................... 10-2017-0167278

(51) Int. Cl.
*G01R 31/00* (2006.01)
*G01R 31/28* (2006.01)
(Continued)

(52) U.S. Cl.
CPC ....... *G01R 31/2886* (2013.01); *G01R 1/0408* (2013.01); *G01R 1/0458* (2013.01);
(Continued)

(58) Field of Classification Search
CPC ............ G01R 31/2874; G01R 31/2875; G01R 31/2891; G01R 1/0458; G01R 31/2642;
(Continued)

(56) References Cited

U.S. PATENT DOCUMENTS

| | | | |
|---|---|---|---|
| 2006/0028327 A1* | 2/2006 | Amis | B60Q 1/305 340/431 |
| 2008/0054261 A1 | 3/2008 | Song et al. | |

(Continued)

FOREIGN PATENT DOCUMENTS

| | | |
|---|---|---|
| KR | 10-0555714 B1 | 3/2006 |
| KR | 10-2008-0022454 A | 3/2008 |

(Continued)

*Primary Examiner* — Raul J Rios Russo
(74) *Attorney, Agent, or Firm* — Rabin & Berdo, P.C.

(57) ABSTRACT

The present invention relates to a history management pad of a semiconductor test socket, a manufacturing method thereof, and a semiconductor test device including the history management pad. According to the present invention, a history management pad of a semiconductor test socket is provided, the history management pad which is installed on one side of the periphery of a socket frame of a semiconductor test socket composed of a socket body and the socket frame, is characterized by including: an insulating molded film member provided with a plurality of electrode units in the thickness direction; a guide film means which is formed above the molded film member and guides and supports the mounting of a tracking chip to the molded film member; the tracking chip which is conductively connected to an upper end part of the electrode units of the molded film member; and a fixing means for fixing the tracking chip to the guide film means, wherein electrode unit lower end parts protruding from socket frame holes formed at positions corresponding to the electrode units are connected to a pad of a socket printed circuit board.

15 Claims, 4 Drawing Sheets

(51) Int. Cl.
   *G01R 1/04*     (2006.01)
   *G01R 31/26*    (2020.01)
   *G01R 31/50*    (2020.01)

(52) U.S. Cl.
   CPC ..... *G01R 31/2642* (2013.01); *G01R 31/2856* (2013.01); *G01R 31/2867* (2013.01); *G01R 31/2868* (2013.01); *G01R 31/2874* (2013.01); *G01R 31/2875* (2013.01); *G01R 31/2891* (2013.01); *G01R 31/50* (2020.01)

(58) Field of Classification Search
   CPC . G01R 31/2856; G01R 31/2867; G01R 31/50
   USPC ......... 324/71, 378, 403, 415, 425, 500, 537, 324/750.01, 750.03
   See application file for complete search history.

(56) References Cited

U.S. PATENT DOCUMENTS

| | | | |
|---|---|---|---|
| 2012/0229158 A1 | 9/2012 | Seo | |
| 2018/0236314 A1* | 8/2018 | Song | A63B 60/06 |
| 2020/0150148 A1* | 5/2020 | Chung | G06F 11/2733 |

FOREIGN PATENT DOCUMENTS

| | | |
|---|---|---|
| KR | 10-2011-0048956 A | 5/2011 |
| KR | 10-2012-0102230 A | 9/2012 |
| KR | 10-1682230 B1 | 12/2016 |

\* cited by examiner

HISTORY MANAGEMENT PAD OF SEMICONDUCTOR TEST SOCKET, MANUFACTURING METHOD THEREOF, AND SEMICONDUCTOR TEST DEVICE INCLUDING HISTORY MANAGEMENT PAD

TECHNICAL FIELD

The present invention relates to a history management pad of a semiconductor test socket, a manufacturing method thereof, and a semiconductor test device including the history management pad, and more specifically, to a history management pad of a semiconductor test socket, a manufacturing method thereof, and a semiconductor test device including the history management pad, in which the history management pad is provided in the semiconductor test socket, and may obtain accurate data by managing history such as lifespan and inventory of the socket, information on a device under test, identification of a position and the like, and accurately determine a time for replacing the socket.

BACKGROUND ART

Generally, a semiconductor package manufacturing process is largely divided into a preprocess, a postprocess and a test process. The preprocess is also referred to as a fabrication (FAB) process, which is a process of forming an integrated circuit on a wafer of a single crystal silicon material. The postprocess is also referred to as an assembly process, which is a process of forming an integrated circuit package (device under test) by dividing the wafer into individual chips, connecting a conductive lead or ball to the chips to make connection of electrical signals to external devices possible, and molding the chips with resin such as epoxy resin to protect the chips from the external environments. The test process is a process of testing whether the integrated circuit package normally operates, and separating good and bad products.

One of core components applied to the test process is a socket. The socket is mounted on a printed circuit board (PCB) electrically connected to a tester for testing an integrated circuit and is in charge of a function of electrically and mechanically connecting the tester and a handler. Here, contact pins of the socket are in charge of a function of electrically connecting a lead of the integrated circuit package and a terminal of the printed circuit board.

The tester creates an electrical signal for testing an integrated circuit package that will be mounted on the socket, outputs the electrical signal to the integrated circuit package, and tests whether the integrated circuit package normally operates using the electrical signal inputted through the integrated circuit package. As a result, the integrated circuit package is determined as a good or bad product.

The handler automatically mounts the integrated circuit package on the socket, withdraws the integrated circuit package from the socket according to a test result of the tester, and disposes the integrated circuit package after determining the package as a bad or good product.

Meanwhile, the price of testers increases recently due to increase of devices under test (DUTs) simultaneously tested for the sake of high speed, high functionality and high productivity of the integrated circuits. To efficiently use the expensive testers, it is very important to select and use an appropriate socket and manage the lifespan of the socket.

If lifespan of a socket is exhausted and performance of the socket is degraded while testing a large quantity of packages, the cases of classifying a semiconductor package of a good quality as a defective one gradually increase, and a very high defective rate is maintained until the defective socket is replaced with a new socket. In addition, as the expensive tester and the handler should be stopped to replace the socket whenever a defective socket is replaced, efficiency of the test is lowered, and as a result, and this may affect the production yield.

To prevent this problem, in the semiconductor industry, gradual increase of the defective rate is prevented by replacing a defective socket with a new socket when a socket reaches a predetermined number of times of using the socket, i.e., a threshold use count, and an appropriate replacement time is managed by grasping the number of good products and bad products, together with the threshold use count. Meanwhile, the replaced socket may be reused through a test after cleansing the socket.

The methods currently used in the semiconductor industry to grasp the threshold use count, the number of good products and the number of bad products as described above will be described below. Although a method of approximately estimating the number of times of using a socket by recording an initial use date on the socket body and grasping the time elapsed from the date is used as a first method, this method may not calculate an accurate data, and it is impossible to grasp all the necessary items such as the number of times of using the socket, the number of good products, the number of bad products and the like. As a second method, there is a method in which the tester or the handler memorizes the data processed by each socket. However, this method may not acquire accurate data as the position of a socket may not be recognized when the position of the socket is changed, and there is a problem in that it is unable to identify the number of times of using a socket reused through a reproduction work such as a cleansing work or the like described above.

DISCLOSURE OF INVENTION

Technical Problem

Therefore, the present invention has been made in view of the above problems, and it is an object of the present invention to provide a history management pad of a semiconductor test socket, a manufacturing method thereof, and a semiconductor test device including the history management pad, in which the history management pad is provided in the semiconductor test socket, and may obtain accurate data by managing history such as lifespan and inventory of the socket, information on a device under test, identification of a position and the like.

Another object of the present invention is to provide a history management pad of a semiconductor test socket, a manufacturing method thereof, and a semiconductor test device including the history management pad, which can prevent a test error caused by the socket by accurately determining a time for replacing the socket, and maintain production yield by estimating an accurate time for replacing the socket and replacing the socket at an idle time.

Technical Solution

To accomplish the above objects, according to a first aspect of the present invention, there is provided a history management pad of a semiconductor test socket, the pad comprising: an insulative mold film member installed at an outer portion of a socket frame of the semiconductor test socket configured of a socket body and the socket frame, and provided with a plurality of electrode units in the thickness direction; a guide film means formed on the top of the mold film member to guide and support a tracking chip when the tracking chip is mounted on the mold film member; the tracking chip conductively contacting with the top of the electrode units of the mold film member; and a fixing means for fixing the tracking chip to the guide film means, wherein lower portions of the electrode units contact with pads of a socket printed circuit board through holes of the socket frame formed at the positions corresponding to the electrode units.

In the first aspect of the present invention, the socket body is an elastic conductive sheet including a conductive unit, in which a plurality of conductive particles is distributed in an insulative elastic material; and an insulative supporting unit for disconnecting electrical contact with an adjacent conductive unit while supporting each conductive unit.

In the first aspect of the present invention, the electrode unit is an elastic electrode unit which forms a conductive path as a plurality of conductive particles is arranged in the thickness direction within the insulative elastic material.

In the first aspect of the present invention, the guide film means includes: a ball guide film member in which position compensation holes for aligning balls of the tracking chip are formed; and a chip guide film member in which a chip guide hole for guiding and supporting the tracking chip is formed.

In the first aspect of the present invention, the fixing means is formed as a film cover covering the tracking chip.

In the first aspect of the present invention, the fixing means is formed of an adhesive or silicon for fixing the tracking chip.

According to a second aspect of the present invention, there is provided a method of manufacturing a history management pad of a semiconductor test socket, the method comprising: a first step of forming, at an outer portion of a socket frame of the semiconductor test socket, an insulative mold film member provided with a plurality of electrode units for electrically connecting electrode balls of the tracking chip to pad electrodes provided in a socket printed circuit board; a second step of attaching a ball guide film member, in which guide holes aligned with the electrode units are formed, on the top surface of the mold film member; a third step of attaching a chip guide film member, in which a chip guide hole for guiding the tracking chip is formed, on the top surface of the ball guide film member; a fourth step of contacting the balls of the tracking chip to the electrode units of the mold film member through the guide holes of the ball guide film member, while guiding the tracking chip through the chip guide hole of the chip guide film member; and a fifth step of fixing the tracking chip on the mold film member.

In the second aspect of the present invention, the first step is accomplished by attaching the insulative mold film member, in which the plurality of electrode units is formed, to the socket frame in which holes corresponding to the electrode units are formed at an outer portion.

In the second aspect of the present invention, the first step is accomplished by providing the mold film member in which holes for forming the electrode units are formed and the socket frame in which holes corresponding to the holes for forming the electrode units are formed at an outer portion, attaching the mold film member at an outer portion of the socket frame in one piece, and filling the electrode units in the holes for forming the electrode units and the holes of the socket frame.

In the second aspect of the present invention, at the fifth step, the tracking chip is fixed by attaching a cover film around an area including the top of the tracking chip.

In the second aspect of the present invention, at the fifth step, the tracking chip is fixed using an adhesive or silicon.

According to a third aspect of the present invention, there is provided a method of manufacturing a history management pad of a semiconductor test socket, the method comprising: a first step of providing an insulative mold film member provided with a plurality of electrode units; a second step of attaching a ball guide film member, in which guide holes aligned with the electrode units are formed, on the top surface of the mold film member; a third step of attaching a chip guide film member, in which a chip guide hole for guiding the tracking chip is formed, on the top surface of the ball guide film member; a fourth step of contacting the balls of the tracking chip to the electrode units of the mold film member through the guide holes of the ball guide film member, while guiding the tracking chip through the chip guide hole of the chip guide film member; a fifth step of fixing the tracking chip on the mold film member; and a sixth step of attaching the mold film member, which has completed gone through the process up to the fifth step, at an outer portion of the socket frame of the semiconductor test socket in which holes corresponding to the electrode units are formed.

In the third aspect of the present invention, at the fifth step, the tracking chip is fixed by attaching a cover film around an area including the top of the tracking chip.

In the third aspect of the present invention, at the fifth step, the tracking chip is fixed using an adhesive or silicon.

According to a fourth aspect of the present invention, there is provided a semiconductor test device comprising: a socket frame provided with the history management pad according to any one of claims 1 to 6 at an outer portion; and a socket guide member provided on the top of the tracking chip and configured to press the tracking chip when a semiconductor test socket is tested.

Advantageous Effects

A history management pad of a semiconductor test socket, a manufacturing method thereof, and a semiconductor test device including the history management pad according to the present invention provides the effects described below.

First, as the history management pad is provided in the semiconductor test socket, the present invention has an effect of obtaining accurate data by managing history such as lifespan and inventory of the socket, information on a device under test, identification of a position and the like.

Second, the present invention has an effect of preventing a device under test of a good quality from being treated as a defective due to the socket, by accurately determining a time for replacing the socket.

Third, the present invention is effective in that production yield is not be affected by estimating an accurate time for replacing a socket and replacing the socket at an idle time.

BEST MODE FOR CARRYING OUT THE INVENTION

Figure 1:
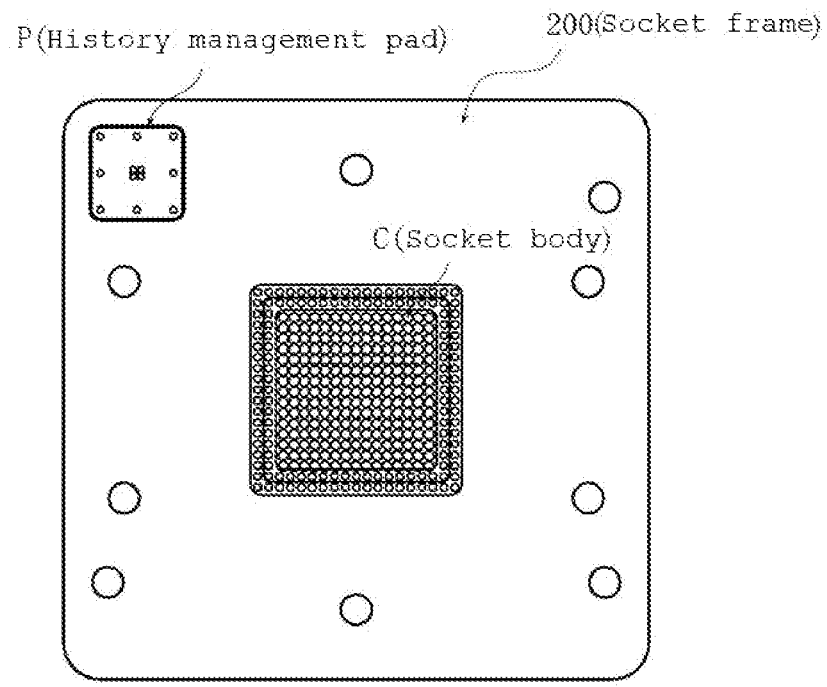
FIG. 1 is a view showing a semiconductor test socket provided with a history management pad of the semiconductor test socket according to the present invention.

Additional objects, features and advantages of the present invention can be understood more clearly from the following detailed description and accompanying drawings.

Before the detailed description of the present invention, it should be understood that as the present invention may make diverse changes and have various embodiments, the examples described below in detail and shown in the drawings are not intended to limit the present invention to a specific embodiment, but include all changes, equivalents, and substitutes included in the spirit and technical scope of the present invention.

It will be understood that when an element is referred to as being "connected" or "coupled" to another element, it may be directly connected or coupled to another element or intervening elements may exist. In contrast, when an element is referred to as being "directly connected" or "directly coupled" to another element, there are no intervening elements.

The terms used herein are used only to describe particular embodiments and are not intended to limit the present invention. Singular expressions include plural expressions, unless the context clearly indicates otherwise. It will be further understood that the terms "include", "have" and the like used herein is to specify the presence of stated features, integers, steps, operations, elements, and/or components, but do not preclude in advance the presence or addition of one or more other features, integers, steps, operations, elements, components, and/or groups thereof.

In addition, the terms such as "section", "unit", "module" and the like stated in the specification mean a unit of processing at least a function or an operation, and they can be implemented as hardware, software or a combination of hardware and software.

In addition, in describing with reference to the accompanying drawings, like reference symbols will be assigned to like constitutional elements regardless of drawing symbols, and duplicated descriptions thereof will be omitted. In describing the present invention, when it is determined that specific description of known techniques related to the present invention unnecessarily blurs the gist of the present invention, the detailed description will be omitted.

Hereinafter, a history management pad of a semiconductor test socket, a manufacturing method thereof, and a semiconductor test device including the history management pad according to a preferred embodiment of the present invention will be described with reference to the accompanying drawings.

First, a history management pad of a semiconductor test socket according to the present invention will be described in detail with reference to FIGS. 1 and 2. FIG. 1 is a view showing a semiconductor test socket provided with a history management pad of the semiconductor test socket according to the present invention, FIG. 2 is a view showing the configuration of a history management pad of a semiconductor test socket according to the present invention, and FIG. 3 is a view showing a configuration provided with a socket guide for pressing a history management pad in a semiconductor test socket according to the present invention.

Figure 2:
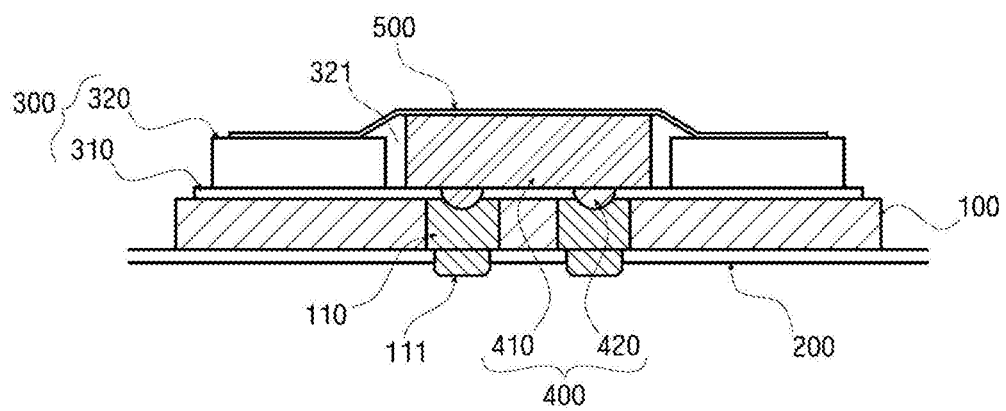
FIG. 2 is a view showing the configuration of a history management pad of a semiconductor test socket according to the present invention.
Figure 3:
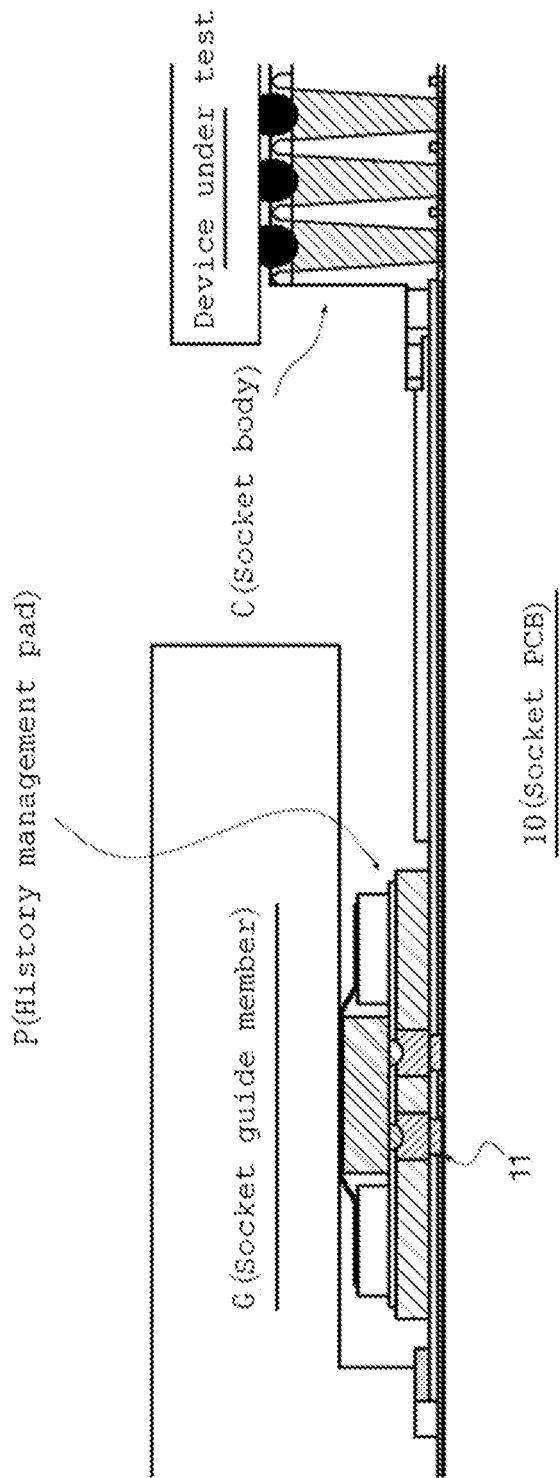
FIG. 3 is a view showing a configuration provided with a socket guide for pressing a history management pad in a semiconductor test socket according to the present invention.

As shown in FIGS. 1 to 3, a history management pad P of a semiconductor test socket according to the present invention is provided at an outer portion of a socket frame 200 of the semiconductor test socket provided with a socket body C (an elastic conductive sheet or a pogo pin body) for electrically contacting a lead of a device under test and a terminal of the printed circuit board of the socket, and the history management pad includes an insulative mold film member 100 provided with a plurality of conductive electrode units 110 in the thickness direction (vertical direction); an insulative mold socket frame 200 having a plurality of holes 210 formed for the lower portions (bumps) 111 of the electrode units 110 to pass through, on the top surface of which the insulative mold film member 100 is attached; a guide film means 300 formed on the top of the mold film member 100 to provide contact stability of a tracking chip 400 by resting the tracking chip 400 on the mold film member 100 while the tracking chip 400 conductively contacts with the electrode units 110 of the mold film member 100; the tracking chip 400 conductively contacting with the electrode units 110 of the mold film member 100 through the guide film means 300; and a fixing means 500 for firmly fixing the tracking chip 400 to the guide film means 300.

The socket body electrically connects a terminal of a device under test and a pad of a test device (socket printed circuit board) and may be an elastic conductive sheet having elasticity or a pogo pin body.

However, the elastic conductive sheet is preferable since smooth contact is possible by absorbing mechanical impacts or deformation. The elastic conductive sheet like this is configured of a conductive unit, in which a plurality of conductive particles is distributed in an insulative elastic material, and an insulative supporting unit for disconnecting electrical contact with an adjacent conductive unit while supporting each conductive unit.

Although the mold film member 100 is preferably formed of, for example, polyimide, it is not limited thereto, and any insulative (nonconductor) material, in which the electrode units 110 can be stably provided, can be used.

The electrode units 110 of the mold film member 100 electrically connect the balls 420 provided in the tracking chip 400 to the pad electrodes 11 provided in the socket printed circuit board 10 (see FIG. 3).

Here, the electrode unit 110 of the mold film member 100 is preferably formed as an elastic electrode unit which forms a conductive path, in which a plurality of conductive particles is distributed to be arranged in the thickness direction within an insulative elastic material such as silicon. The reason that the elastic electrode unit is preferable like this is that if the top of the tracking chip 400 of the history management pad of the semiconductor test socket is pressed through a socket guide member G (see FIG. 3) in association with a test operation of a device under test when the device under test is tested, the electrode unit 110 may smoothly contact with the pad electrode while being elastically deformed.

However, if the electrode units 110 of the mold film member 100 are configured to flow current between the balls 420 of the tracking chip 400 and the pad electrodes 11 of the socket printed circuit board 10, they are not specially limited.

In addition, the socket frame 200 is for supporting the elastic conductive sheet or the pogo pin body and aligning the socket in a lubber socket for testing or a socket for pogo pin and is formed of a material such as stainless steel, polyimide or the like, and in the present invention, the history management pad P may be attached at an outer portion of the socket frame 200.

Next, the guide film means 300 includes a ball guide film member 310 in which a plurality of position compensation holes 311 is formed at the positions corresponding to the balls 420 of the tracking chip 400, and a chip guide film member 320 in which a chip guide hole 321 for guiding the body 410 of the tracking chip 400 is formed.

As the guide film means 300 including the ball guide film member 310 and the chip guide film member 320 like this is configured, contact stability of the tracking chip 400 can be achieved.

Subsequently, the tracking chip 400 is designed to obtain data on the information related to history management and test of the socket, such as information on the inventory and lifespan of the socket and information on the device under test, and the detailed configuration of the tracking chip may be designed through a publicized method, and detailed description thereof will be omitted to clarify the target of the present invention.

Next, a fixing means for fixing the tracking chip 400 to the guide film member 300 is not specially limited if the fixing means is a configuration which can fix the guide film member 300 and the tracking chip 400.

For example, as shown in the figure, the fixing means may be configured as a cover film 500 attached to cover the top surface of the tracking chip 400 (specifically, together with the top surface of the chip guide film member 320 of the guide film means 300). In addition, as another example, the fixing means may fix the tracking chip 400 by using an adhesive, silicon or the like.

The history management pad of a semiconductor test socket according to the present invention configured as described above is attached and fixed at an outer portion of the socket frame 200 of the semiconductor test socket in which penetration holes are formed to expose the electrode units 110 of the mold film member 100 toward the bottom.

Figure 4:
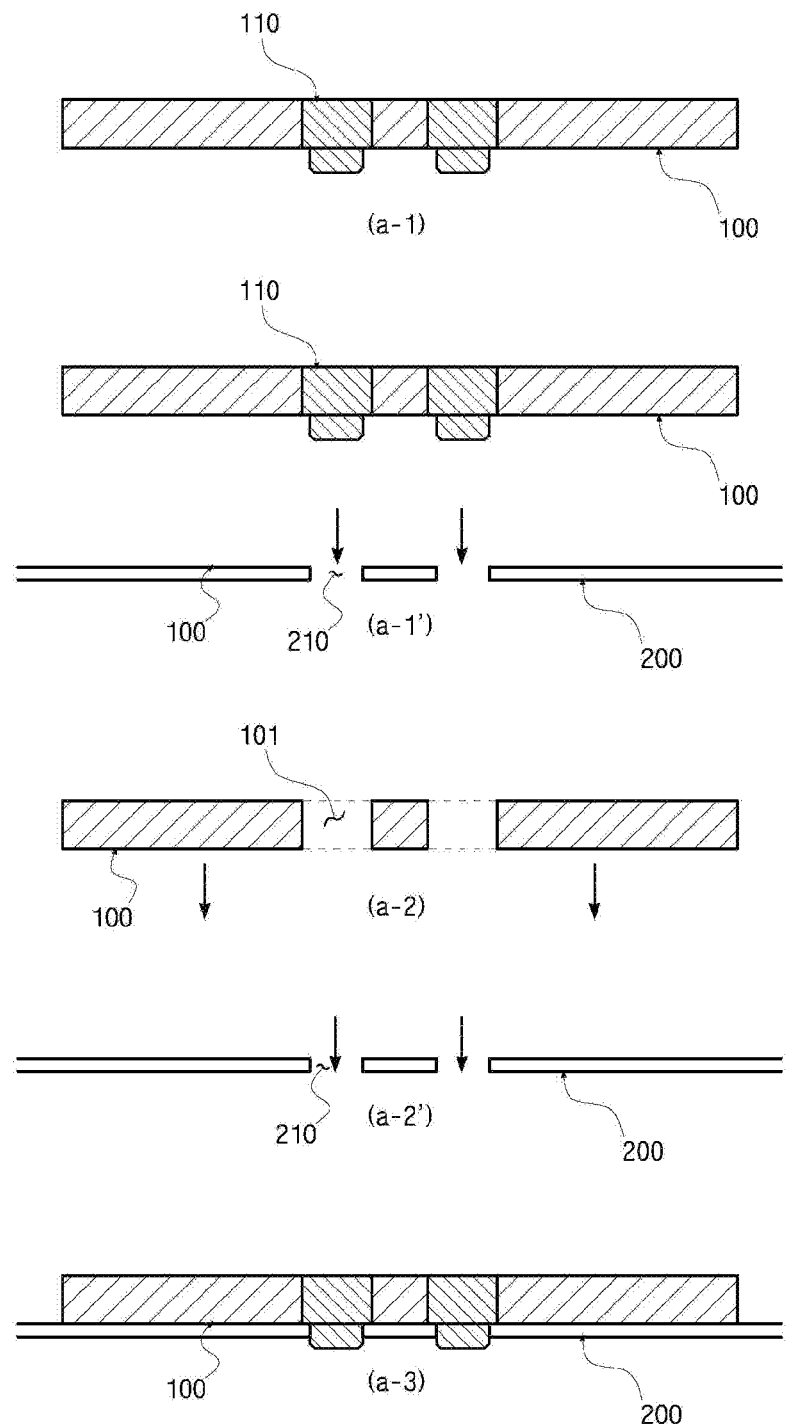
FIG. 4 is a view showing the manufacturing process of a history management pad of a semiconductor test socket according to an embodiment of the present invention.
Figure 5:
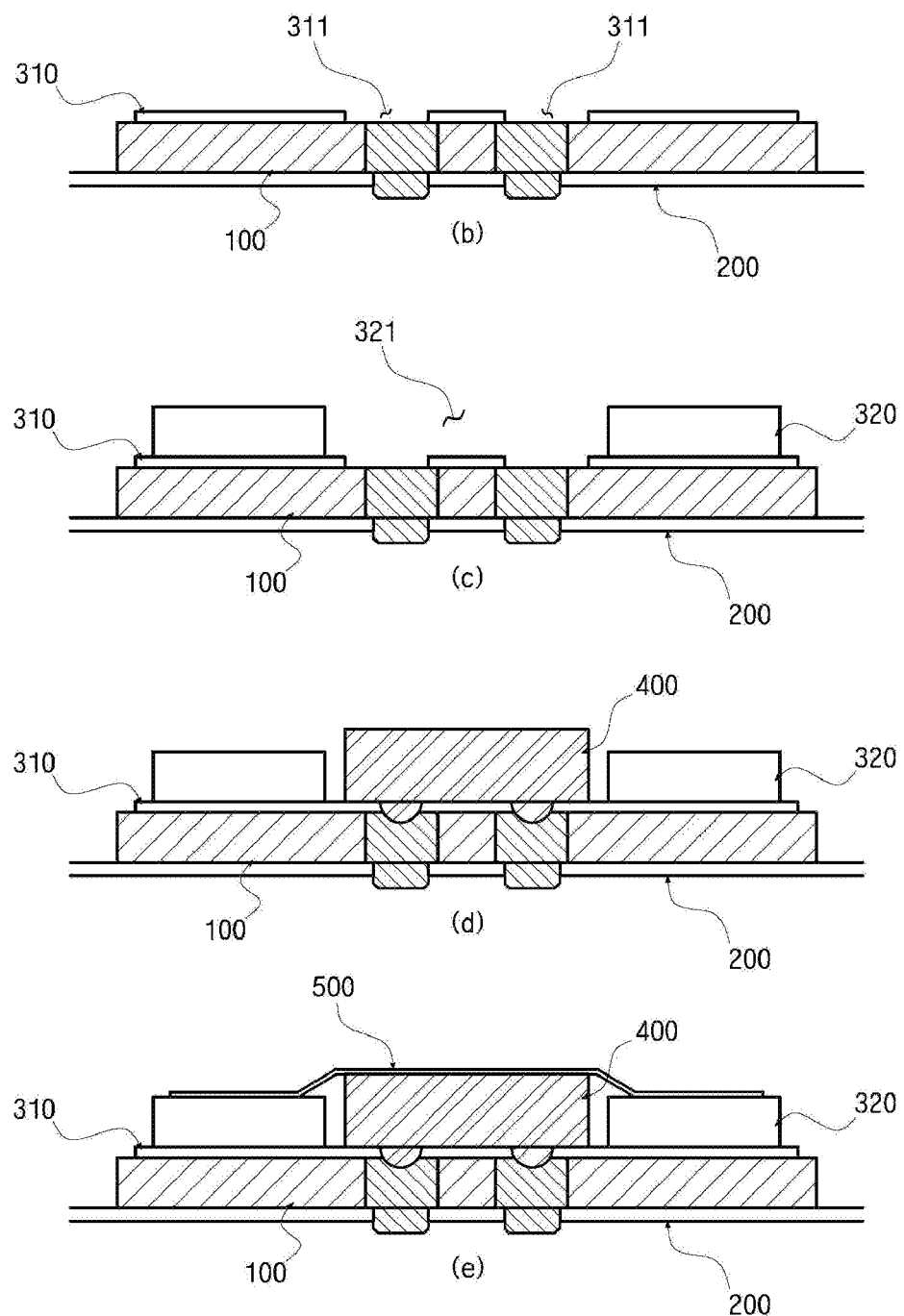
FIG. 5 is a view showing a process following the process of FIG. 4.

Next, a method of manufacturing a history management pad of a semiconductor test socket according to an embodiment of the present invention will be described in detail with reference to FIGS. 4 and 5. FIGS. 4 and 5 are views showing the manufacturing process of a history management pad of a semiconductor test socket according to an embodiment of the present invention. In the description of the manufacturing process of the history management pad of the semiconductor test socket described below, the same numerals and symbols are assigned to the elements the same as the elements described in the description of the history management pad of a semiconductor test socket, and repeated description will be omitted to simplify the description of the present invention.

As shown in FIGS. 4 and 5, the method of manufacturing a history management pad of a semiconductor test socket according to an embodiment of the present invention includes: a first step of forming a plurality of electrode units 110 at an outer portion of the socket frame 200 of the semiconductor test socket by attaching an insulative mold film member 100 to a socket frame 200, in which holes 210 are formed to electrically connect the balls 420 of the tracking chip 400 and the pad electrodes 11 of the socket printed circuit board (FIG. 4(a)); a second step of attaching a ball guide film member 310, in which position compensation holes (or guide holes) 311 aligned with the electrode units 110 are formed, on the top surface of the mold film member 100; a third step of attaching the chip guide film member 320, in which a chip guide hole 321 for guiding the tracking chip 400 is formed, on the top surface of the ball guide film member 310; a fourth step of positioning the balls of the tracking chip 400 to the electrode units 110 of the mold film member 100 through the position compensation holes 311 of the ball guide film member 310, while guiding the tracking chip 400 through the chip guide hole 321 of the chip guide film member 320; and a fifth step of fixing the tracking chip 400.

The first step may be accomplished in two methods described below.

As a first method of the first step, an insulative mold film member 100 in which electrode units 110 are formed may be integrated with a socket frame 200 (FIG. 4(a-3)) in one piece by attaching an insulative mold film member 100, in which the electrode units 110 are formed in the holes 101 for forming the electrode units 110 (FIG. 4(a-1)), to a socket frame 200 in which holes 210 corresponding to the electrode units 110 are formed at an outer portion (FIG. 4(a-1')).

As a second method of the first step, the history management pad may be formed by providing a mold film member 100 in which holes 101 for forming the electrode units are formed as shown in FIG. 4(a-2) and a socket frame 200 in which holes 210 corresponding to the holes 101 for forming the electrode units 110 are formed at an outer portion, attaching the mold film member 100 and the socket frame 200 in one piece, and filling the electrode units 110 in the holes 101 and 210 (FIG. 4(a-3)).

The mold film member 100 may be formed of, for example, a polyimide material, and the socket frame 200 may be formed of a stainless steel material.

The lower portion of the electrode unit 110 may be formed to protrude from the bottom surface of the socket frame 200 to some extent (i.e., to form a bump 111).

The electrode unit 110 is preferably formed as, for example, an elastic electrode unit which forms a conductive path as a plurality of conductive particles is distributed to be arranged in the thickness direction within an insulative elastic material such as silicon.

Subsequently, the second step (the step of forming a ball guide film member), the third step (the step of forming a chip guide film member) and the fourth step (the step of installing a tracking chip) align positions of the balls of the tracking chip 400 when the tracking chip 400 is installed and guide and stably support the tracking chip 400 to stably accomplish contact of the tracking chip 400.

Next, the fifth step is a step of fixing the tracking chip 400, and if a method may fix the tracking chip, it is not specially limited.

For example, the fifth step may fix the tracking chip by attaching a cover film 500 on the top of the tracking chip 400 and the chip guide film member 320, and as another example, the tracking chip 400 may be fixed using an adhesive, silicon or the like.

In addition, as still another example, a method of manufacturing a history management pad P by applying the second to fifth steps to the insulative mold film member 100 (FIG. 4(a-1)), in which the electrode units 110 are formed in the holes 101 for forming the electrode units 110 as described above, and attaching the history management pad at an outer portion of the socket frame 200 is also possible. According to the embodiment like this, since the history management pad P may be manufactured in advance, an effect of enhancing work productivity may be obtained.

The present invention as described above may obtain accurate data by managing history such as lifespan management and inventory management of the socket, information on the device under test, identification of the position and the like, and has an advantage of preventing a device under test of a good quality from being treated as a defective one due to the socket, by accurately determining a time for replacing the socket.

In addition, the present invention is advantageous in that production yield is not be affected by estimating an accurate time for replacing a socket and replacing the socket at an idle time.

The embodiments described in this specification and the attached drawings merely illustrate part of the technical spirit included in the present invention. Accordingly, since the embodiments disclosed in this specification are intended not to limit, but to describe the spirit of the present invention, it is apparent that the scope of the technical spirit of the present invention is not limited by the embodiments. It should be interpreted that all modifications and specific embodiments, which can be easily inferred by those skilled in the art within the scope of the technical spirit included in the specification and drawings of the present invention, are included in the scope of the present invention.

What is claimed is:

1. A history management pad of a semiconductor test socket, the pad comprising:
    an insulative mold film member installed at an outer portion of a socket frame of the semiconductor test socket configured of a socket body and the socket frame, and provided with a plurality of electrode units in a thickness direction;
    a guide film means formed on a top of the insulative mold film member to guide and support a tracking chip when the tracking chip is mounted on the insulative mold film member;
    the tracking chip conductively contacting with a top of the electrode units of the insulative mold film member; and
    a fixing means for fixing the tracking chip to the guide film means, wherein
    lower portions of the electrode units contact with pads of a socket printed circuit board through holes of the socket frame formed at positions corresponding to the electrode units.

2. The history management pad according to claim 1, wherein the socket body is an elastic conductive sheet including
    a conductive unit, in which a plurality of conductive particles is distributed in an insulative elastic material; and
    an insulative supporting unit for disconnecting electrical contact with an adjacent conductive unit while supporting each conductive unit.

3. The history management pad according to claim 1, wherein the electrode unit is an elastic electrode unit which forms a conductive path as a plurality of conductive particles is arranged in a thickness direction within an insulative elastic material.

4. The history management pad according to claim 1, wherein the guide film means includes:
    a ball guide film member in which position compensation holes for aligning balls of the tracking chip are formed; and
    a chip guide film member in which a chip guide hole for guiding and supporting the tracking chip is formed.

5. The history management pad according to claim 1, wherein the fixing means is formed as a film cover covering the tracking chip.

6. The history management pad according to claim 1, wherein the fixing means is formed of an adhesive or silicon for fixing the tracking chip.

7. A method of manufacturing a history management pad of a semiconductor test socket, the method comprising:
    a first step of forming, at an outer portion of a socket frame of the semiconductor test socket, an insulative mold film member provided with a plurality of electrode units for electrically connecting electrode balls of the tracking chip to pad electrodes provided in a socket printed circuit board;
    a second step of attaching a ball guide film member, in Which guide holes aligned with the electrode units are formed, to a top surface of the insulative mold film member;
    a third step of attaching a chip guide film member, in which a chip guide hole for guiding the tracking chip is formed, to a top surface of the ball guide film member;
    a fourth step of contacting the balls of the tracking chip to the electrode units of the insulative mold film member through the guide holes of the ball guide film member, while guiding the tracking chip through the chip guide hole of the chip guide film member; and
    a fifth step of fixing the tracking chip on the insulative mold film member.

8. The method according to claim 7, wherein the first step is accomplished by attaching the insulative mold film member, in which the plurality of electrode units is formed, to the socket frame in which holes corresponding to the electrode units are formed at an outer portion.

9. The method according to claim 7, wherein the first step is accomplished by providing the mold film member in which holes for forming the electrode units are formed and the socket frame in which holes corresponding to the holes for forming the electrode units are formed at an outer portion, attaching the mold film member at an outer portion of the socket frame in one piece, and filling the electrode units in the holes for forming the electrode units and the holes of the socket frame.

10. The method according to claim 7, wherein at the fifth step, the tracking chip is fixed by attaching a cover film around an area including a top of the tracking chip.

11. The method according to claim 7, wherein at the fifth step, the tracking chip is fixed using an adhesive or silicon.

12. A method of manufacturing a history management pad of a semiconductor test socket, the method comprising:
    a first step of providing an insulative mold film member provided with a plurality of electrode units;
    a second step of attaching a ball guide film member, in which guide holes aligned with the electrode units are formed, to a top surface of the insulative mold film member;
    a third step of attaching a chip guide film member, in which a chip guide hole for guiding the tracking chip is formed, to a top surface of the ball guide film member;
    a fourth step of contacting the balls of the tracking chip to the electrode units of the insulative mold film member through the guide holes of the ball guide film member, while guiding the tracking chip through the chip guide hole of the chip guide film member;
    a fifth step of fixing the tracking chip on the insulative mold film member; and a sixth step of attaching the insulative mold film member, Which has completed gone through the process up to the fifth step, at an outer portion of the socket frame of the semiconductor test socket in which holes corresponding to the electrode units are formed.

13. The method according to claim 12, wherein at the fifth step, the tracking chip is fixed by attaching a cover film around an area including a top of the tracking chip.

14. The method according to claim 12, wherein at the fifth step, the tracking chip is fixed using an adhesive or silicon.

15. A semiconductor test device comprising:
- a socket frame provided with the history management pad according to claim 1 at an outer portion; and
- a socket guide member provided on a top of the tracking chip and configured to press the tracking chip when a semiconductor test socket is tested.

* * * * *